(12) United States Patent
Corbin et al.

(10) Patent No.: US 10,090,180 B2
(45) Date of Patent: *Oct. 2, 2018

(54) PACKAGE ASSEMBLY FOR THIN WAFER SHIPPING AND METHOD OF USE

(71) Applicant: INTERNATIONAL BUSINESS MACHINES CORPORATION, Armonk, NY (US)

(72) Inventors: Damyon L. Corbin, Jericho, VT (US); Charles F. Musante, Burlington, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/292,613

(22) Filed: Oct. 13, 2016

(65) Prior Publication Data

US 2017/0032993 A1    Feb. 2, 2017

Related U.S. Application Data

(63) Continuation of application No. 14/036,999, filed on Sep. 25, 2013, now Pat. No. 9,543,175.

(51) Int. Cl.
*H01L 21/673* (2006.01)
*B65B 5/06* (2006.01)
(Continued)

(52) U.S. Cl.
CPC .......... *H01L 21/67396* (2013.01); *B65B 5/06* (2013.01); *B65B 7/16* (2013.01);
(Continued)

(58) Field of Classification Search
CPC ......... H01L 21/67396; H01L 21/67369; H01L 21/67379; H01L 21/67386; H01L 21/67; B65D 85/48; B65D 85/30
(Continued)

(56) References Cited

U.S. PATENT DOCUMENTS 2,979,246 A * 4/1961 Liebeskind ............ B65D 5/509
156/245
3,102,311 A   9/1963 Martin et al.
(Continued)

FOREIGN PATENT DOCUMENTS

JP    2007314208    12/2007
JP    4924033       4/2012
(Continued)

OTHER PUBLICATIONS

International Search Report and Written Opinion for related Application No. PCT/IB2014/062985, dated Oct. 14, 2014, 9 pages.

*Primary Examiner* — Steven A. Reynolds
(74) *Attorney, Agent, or Firm* — Steven Meyers; Andrew M. Calderon; Roberts Mlotkowski Safran Cole & Calderon, P.C.

(57) ABSTRACT

A package assembly for thin wafer shipping using a wafer container and a method of use are disclosed. The package assembly includes a shipping container and a wafer container having a bottom surface and a plurality of straps attached thereto placed within the shipping container. The package assembly further includes upper and lower force distribution plates provided within the shipping container positioned respectively on a top side and bottom side thereof.

12 Claims, 5 Drawing Sheets

(51) Int. Cl.
 *B65B 7/16*  (2006.01)
 *B65B 61/20*  (2006.01)

(52) U.S. Cl.
 CPC ........ *B65B 61/20* (2013.01); *H01L 21/67369* (2013.01); *H01L 21/67379* (2013.01); *H01L 21/67386* (2013.01)

(58) Field of Classification Search
 USPC ................................ 206/454, 710, 711, 451
 See application file for complete search history.

(56) References Cited

U.S. PATENT DOCUMENTS

| | | | |
|---|---|---|---|
| 3,486,200 A | 12/1969 | Orenick | |
| 4,688,979 A | 8/1987 | Kupersmit | |
| 4,850,283 A | 7/1989 | Carvin | |
| 5,682,997 A * | 11/1997 | Bartholomew | .... B65D 71/0092 206/451 |
| 5,931,205 A | 8/1999 | Jasica et al. | |
| 6,237,771 B1 | 5/2001 | Haq | |
| 6,286,684 B1 * | 9/2001 | Brooks | ............. H01L 21/67369 206/303 |
| 6,341,695 B1 * | 1/2002 | Lewis | ............... H01L 21/67369 206/303 |
| 6,533,123 B1 | 3/2003 | Nakamura et al. | |
| 6,662,950 B1 | 12/2003 | Cleaver | |
| 6,988,620 B2 | 1/2006 | Haggard et al. | |
| 7,059,475 B2 | 6/2006 | Zabka et al. | |
| 7,225,929 B2 * | 6/2007 | Forsyth | ............. H01L 21/67346 206/710 |
| 7,431,162 B2 | 10/2008 | Forsyth | |
| 7,918,341 B2 | 4/2011 | Pylant et al. | |
| 8,104,619 B2 | 1/2012 | Pylant et al. | |
| 8,393,471 B2 | 3/2013 | Ochoa et al. | |
| 8,397,917 B2 | 3/2013 | Kasama et al. | |
| 8,870,503 B2 * | 10/2014 | Stromberg | ................ B60P 7/06 410/97 |
| 9,714,113 B2 * | 7/2017 | Jung | ....................... B65D 15/00 |
| 2005/0098473 A1 | 5/2005 | Sheehan, Jr. | |
| 2005/0109651 A1 | 5/2005 | Fujimori | |
| 2005/0194279 A1 | 9/2005 | Coppola et al. | |
| 2010/0101635 A1 | 4/2010 | Koester et al. | |
| 2011/0158761 A1 * | 6/2011 | Jackson | ............. B65D 71/0088 410/96 |
| 2012/0181215 A1 | 7/2012 | Brooks et al. | |
| 2012/0279896 A1 * | 11/2012 | Lantz | ..................... B65D 25/16 206/584 |
| 2013/0140303 A1 * | 6/2013 | James | ................. B65D 5/5035 220/1.5 |
| 2013/0240398 A1 | 9/2013 | Garner et al. | |

FOREIGN PATENT DOCUMENTS

| | | |
|---|---|---|
| JP | 2012071878 | 4/2012 |
| JP | 4943387 | 5/2012 |
| JP | 2013145768 | 7/2013 |
| KR | 20070012370 | 1/2007 |
| WO | 2005113375 | 12/2005 |
| WO | 2011135639 | 11/2011 |

\* cited by examiner

PACKAGE ASSEMBLY FOR THIN WAFER SHIPPING AND METHOD OF USE

FIELD OF THE INVENTION

The invention relates to packaging assemblies and, more particularly, to a package assembly for thin wafer shipping using a wafer container and a method of use.

BACKGROUND

Semiconductor wafer manufacturing utilizes very sophisticated wafer processing procedures and complicated manufacturing systems. In efforts to reduce the size of the semiconductor package, manufacturers have reduced component sizes including the thickness of the wafer, itself. For example, wafer thinning can be performed by a grinding method to achieve a wafer thickness on the order of 100 microns and less. These thin wafers, though, are very fragile and brittle. Of particular concern are thinned wafers with through silicon vias (TSV), which can be about 25% as strong as non TSV wafers. For example, as the fracture strength varies with the square of wafer thickness, a force to break the thin wafers can be around 1N or less.

Shipping of thin wafers is thus a difficult challenge. Currently, for example, the wafers are placed into plastic containers for shipping. In known implementations, the wafers are manually placed into the containers with foam cushions on the bottom and on top and thin cleanroom paper dispersed between each wafer. Once placed into the containers, a top is placed onto the container. However using these containers and methods of insertion, the thinned wafers are subjected to an unacceptably high risk of damage. For example, when the thin wafers are flexed, whether during the packaging or shipping process, they become susceptible to micro-crack generation, which ultimately leads to wafer breakage.

Also, existing methods for loading and unloading thin, fragile wafers into and out of shipping containers is prone to causing wafer breakage. For example, dicing vendors prefer to manually remove thin, fragile wafers instead of extracting them from shipping containers with vacuum wands. However, wafers easily break if they contact the wall of the shipping container while they are being placed into and/or removed from the shipping container. This problem will only grow worse as the industry trends to even thinner wafers.

Accordingly, there exists a need in the art to overcome the deficiencies and limitations described hereinabove.

SUMMARY

In an aspect of the invention, a package assembly comprises a shipping container and a wafer container having a bottom surface and a plurality of straps attached thereto placed within the shipping container. The package assembly further comprises upper and lower force distribution plates provided within the shipping container positioned respectively on a top side and bottom side thereof.

In an aspect of the invention, a package assembly comprises a wafer container comprising a plurality of straps. The package assembly further comprises a stack of wafers interposed with ESD compliant material sheets positioned within the wafer container. The package assembly further comprises a distribution plate positioned on a top side and bottom side of the stack of wafers. The distribution plates are structured to: contain the stack of wafers as a unit; and distribute forces across a surface of the stack of wafers.

In an aspect of the invention, a method comprises: spreading straps of a wafer container to expose a bottom surface thereof; placing a lower force distribution plate on the bottom surface of the wafer container; alternately stacking a plurality of wafers and sheets on the lower force distribution plate; placing an upper force distribution plate on an upper sheet of the stack of wafers; lifting the wafer container and placing it within a shipping container; placing foam cushioning within the shipping container to protect the stack of wafers; and sealing the shipping container.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to packaging assemblies and, more particularly, to a package assembly for thin wafer shipping using a wafer container and a method of use. More specifically, the present invention is directed to a wafer container (also referred to as a wafer basket or wafer cartridge) for holding thin wafers. Advantageously, the wafer container allows fragile wafers to be loaded into and unloaded from a shipping container without breakage or damage from contacting the walls of the shipping container. Thus, the present invention prevents breakage of the thin wafers during the shipping process, e.g., packaging and unpackaging of the thin wafers.

In embodiments, the wafer container includes straps provided in many different configurations as described herein, which allow the wafer container to be packaged into and unpackaged from the shipping container. In embodiments, the straps can be hinged or made of flexible material, any of which configuration has a length extending beyond an upper portion of the shipping container to provide a means for grasping the straps for such packaging and unpackaging. By using the wafer container, the probability of wafer breakage decreases significantly over existing approaches. In fact, tests have shown that a success rate of 100% can be achieved with shipping sub-100 μm thickness wafers.

In addition to using the wafer container, force distribution plates can be used within the package assembly to reduce flexing of the thin wafers while in transit. The force distribution plates are rigid plates placed below and above a stack of thin wafers in a container, thereby restricting flexure of the wafer and reducing wafer breakage. In embodiments, the force distribution plates can be placed within the wafer container with the stack of wafers. In other embodiments, the straps can be directly fastened to the force distribution plates, for packaging into and unpackaging from the shipping container.

Figure 1:
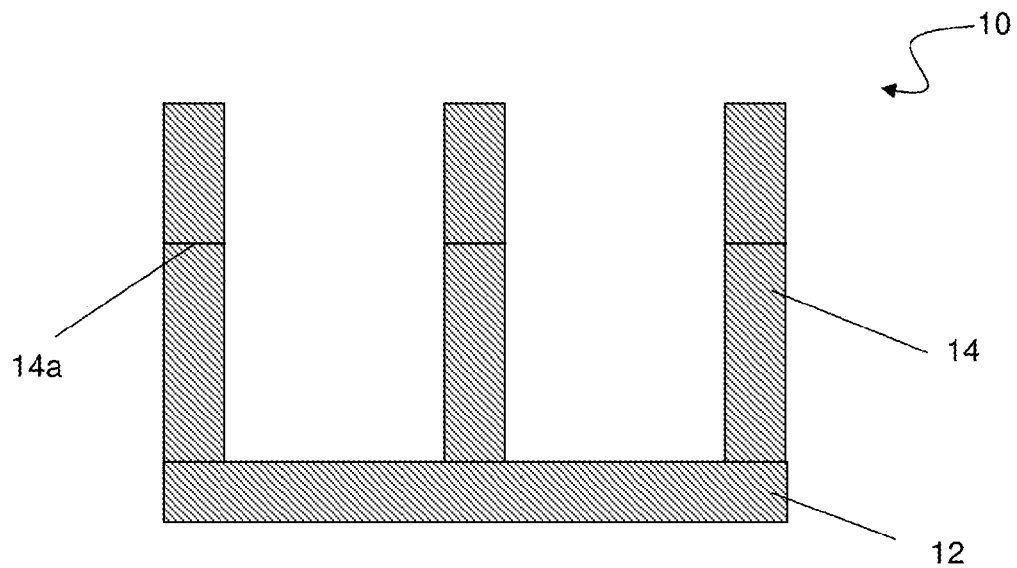
FIG. 1 shows a wafer container in accordance with aspects of the present invention.
Figure 1:
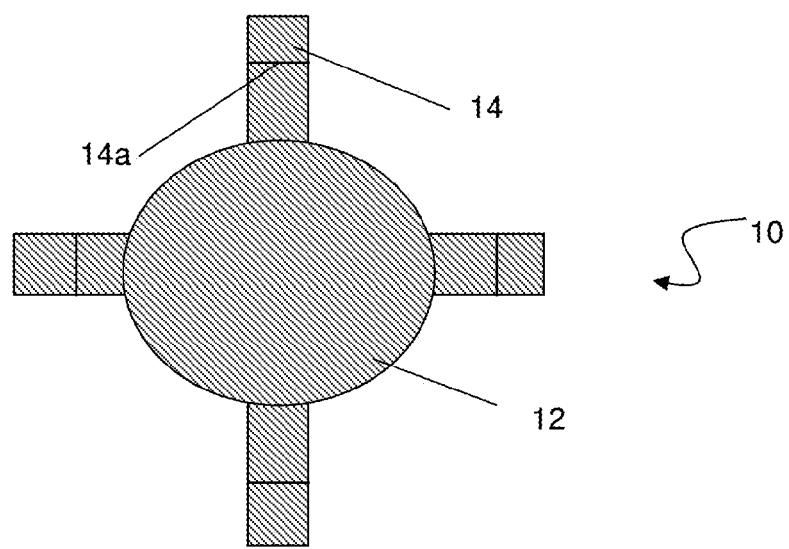

FIG. 1 shows a wafer container in accordance with aspects of the present invention. In embodiments, the wafer container 10 includes a bottom surface 12 and a plurality of straps 14. Preferably, the bottom surface 12 has a diameter approximate to that of the wafers, e.g., 200 mm, 300 mm, etc. The straps 14 can have a hinge 14a located above a maximum height of stacked wafers and/or a force distribution plate as described herein. For example, the hinge 14a can be at a height of about the total height of the stack of wafers with force distribution plates and protective sheets. In additional or alternative embodiments, the straps 14 can be made of a flexible material. It should be understood by those of skill in the art that the hinge 14a can be considered a flexible feature of the strap 14. In embodiments, the wafer container 10 (including the bottom surface 12 and straps 14) can be made of any electrostatic discharge (ESD) compliant material such as, for example, plastic with conductive coatings, TYVEK® (TYVEK is a trademark of DuPont Company) or other ESD compliant materials.

Still referring to FIG. 1, in embodiments, three or more straps 14 are attached or bonded to the bottom surface 12 of the wafer container 10. In any of the configurations, the straps 14 are preferably located equidistance from one another. For example, in the three strap configuration, each strap would be located at 120° about the circumference of the bottom surface 12. The spacing of the straps 14 will provide stability to the wafer container 10 during loading and unloading of the wafers into and out of a shipping container, respectively.

Figure 2:
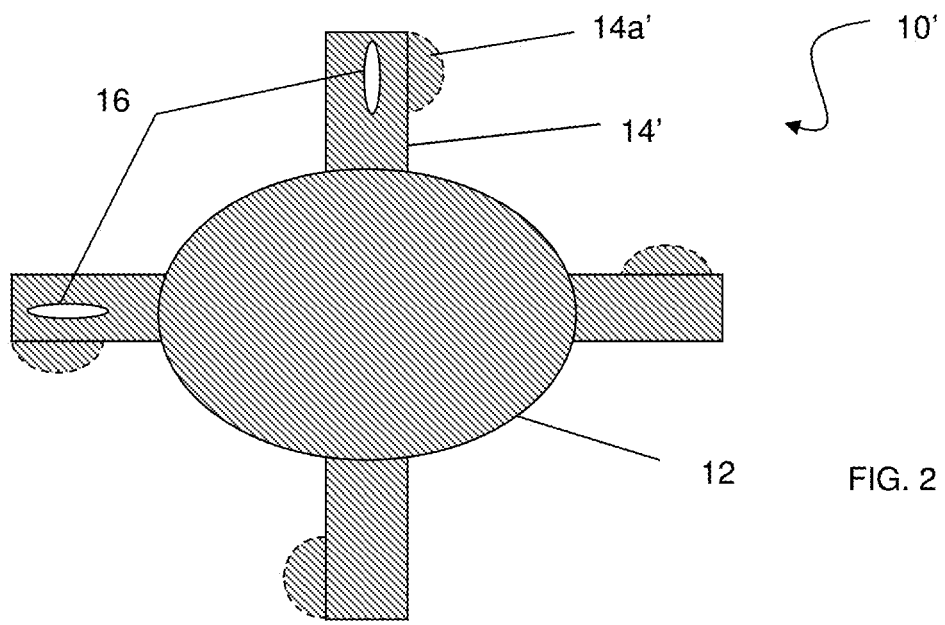
FIG. 2 shows a wafer container in accordance with another aspect of the present invention.

FIG. 2 shows a wafer container in accordance with another aspect of the present invention. In this aspect of the invention, the wafer container 10' includes straps 14' with optional tabs 14a' and optional slits 16. It should be understood by those of skill in the art that any combination of the optional tabs 14a' and optional slits 16 can be implemented with the present invention. In embodiments, the optional tabs 14a' provide a mechanism for grasping of the straps 14' for ease of handling. The optional slits 16, on the other hand, provide a mechanism for attaching straps 14' together when packaging the wafers (and optional force distribution plates). By way of example, a strap can be inserted within the slit 16 of another strap to secure the straps together. In alternative or additional embodiments, reference numeral 16 can represent other fastening mechanisms such as, for example, fabric hook-and-loop fasteners (e.g., Velcro®).

Figure 3:
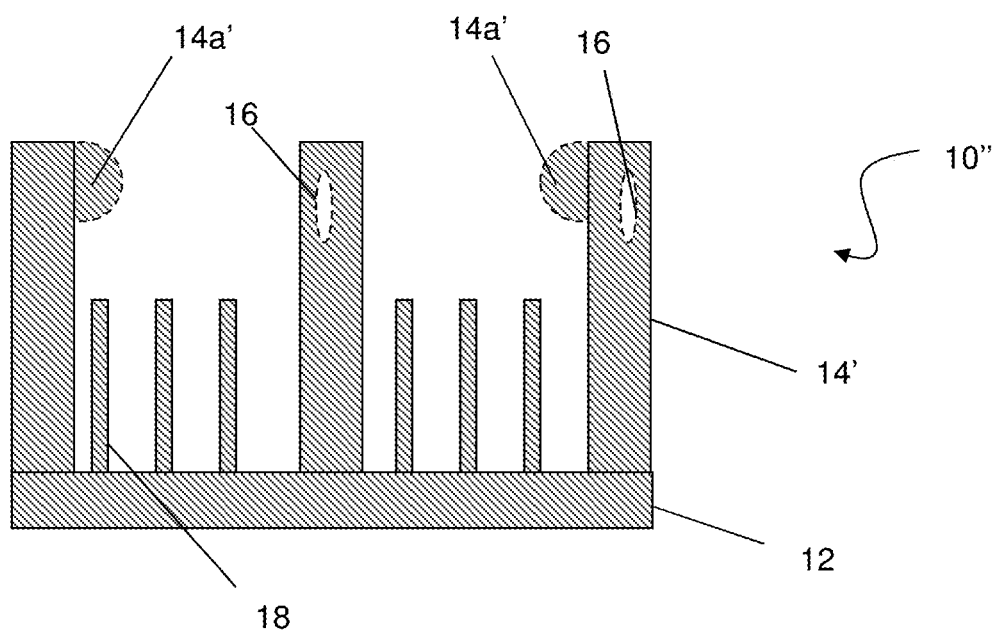
FIG. 3 shows a wafer container in accordance with yet another aspect of the present invention.

FIG. 3 shows a wafer container in accordance with yet another aspect of the present invention. In this aspect of the invention, the wafer container 10'' includes tabs 18 which provide a lateral cushioning for the wafers when inserted into a shipping container. The tabs 18 can be provided about the circumference of the bottom surface 12, and can be made from any ESD compliant material as already described herein. In embodiments, the tabs 18 should have a height of about a stack of wafers packed within the wafer container 10'', e.g., the total height of the stack of wafers with force distribution plates and protective sheets. Again, it should be understood by those of skill in the art that any combination of the optional tabs 14a', optional slits 16 and optional tabs 18 can be implemented with the present invention.

Figure 4:
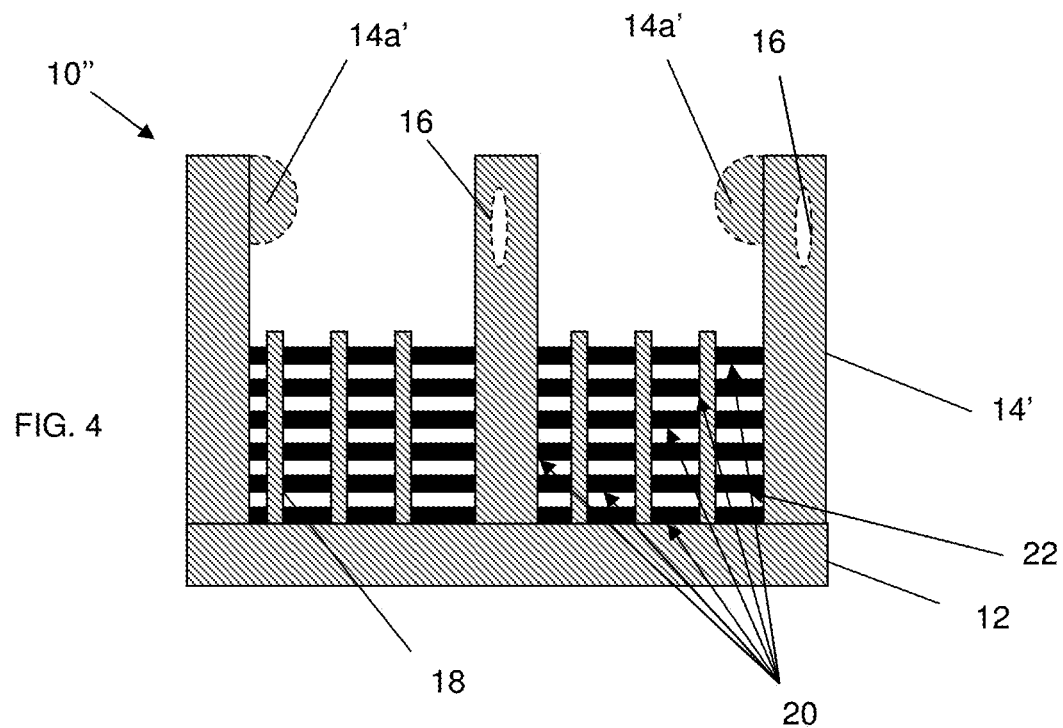
FIG. 4 shows a side view of a wafer container with wafers loaded therein, in accordance with aspects of the present invention.

FIG. 4 shows a side view of a wafer container with wafers loaded therein, in accordance with additional aspects of the present invention. More specifically, FIG. 4 shows the wafer container 10'' of FIG. 3 holding a plurality of wafers 20. In this implementation and others, the wafers 20 are placed in the wafer container 10'' and are separated and protected by sheets of cleanroom paper, TYVEK® or other clean and ESD compliant material sheets, all of which are designated as reference numeral 22. The ESD compliant material sheets 22 prevent rubbing and scratching of the wafers 20. As also shown, the tabs 18 have a height of about a stack of wafers 20 packed within the wafer container 10''. It should be understood by those of skill in the art that the plurality of wafers 20 can be packed into any of the wafer containers described herein, in a similar manner.

Figure 5:
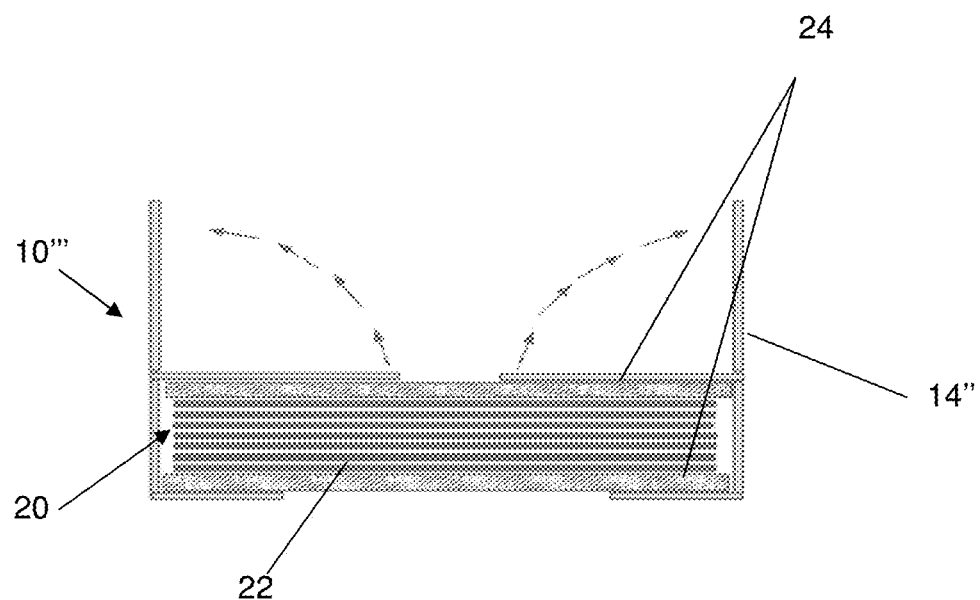
FIG. 5 shows a side view of an alternative wafer container with wafers loaded therein, in accordance with additional aspects of the present invention.

FIG. 5 shows a side view of an alternative wafer container with wafers loaded therein, in accordance with additional aspects of the present invention. In this configuration, the wafer container 10''' includes straps 14'' connected directly to a bottom force distribution plate 24. That is, the wafer container 10''' no longer includes a bottom surface as shown in FIGS. 1-4. The straps 14'' can be bonded to the force distribution plate 24 with an adhesive or other bonding mechanism.

In this configuration, the bottom force distribution plate is provided on a bottom of a stack of wafers 20, 22, and a top force distribution plate 24 is provided on a top side the stack of wafers 20, 22. Advantageously, by using the force distribution plates 24 in combination with the wafer container (of any aspect of the invention), it is now possible to ship upwards of 13 or more 75 micron thin wafers 20, without damage; compared to conventional systems which are able to stack only six wafers, with the possibility of damage occurring to some of those wafers. Accordingly, in aspects of the present invention, the wafer container (of FIGS. 1-5) should be sized and structured to accommodate upwards of 13 or more 75 micron thin wafers 20 and two force distribution plates 24.

The force distribution plates 24 are reasonably flat and rigid, thereby preventing flexure of the wafers during shipping. The force distribution plates 24 are also sized to fit within a shipping container and wafer container of any aspect of the present invention. The force distribution plate 24, for example, can be standard thickness silicon wafers or some other suitable material fabricated into force distribution plates, e.g., any ESD (electro-static discharge) compliant material such as metal discs, plastic discs with conductive coatings or other materials. The force distribution plate 24 can have a thickness of about 1 mm to about 2 mm; although other dimensions are contemplated by the present invention, depending on the material used to fabricate the force distribution plate 24.

During shipping, the force distribution plates 24 advantageously distribute forces over the entire surface of the wafers, thus reducing the overall force applied to any single point on the wafer. For example, vibration forces occurring during shipping as well as vertical forces applied onto the wafers during packaging and unpackaging can be distributed over the entire surface of the wafers, thereby reducing or eliminating a larger force being applied to any single point or small area on the wafer. In more specific embodiments, the force distribution plate 24 is rigid enough to withstand at least 1N or more of force, to prevent flexure of the thinned wafers. Essentially, the force distribution plates 24 act to contain the thin wafers 20 as a unit, allowing them to move only as a unit and distribute all forces across the wafer surface thereby reducing and/or eliminating any damage to the wafers.

Figure 6:
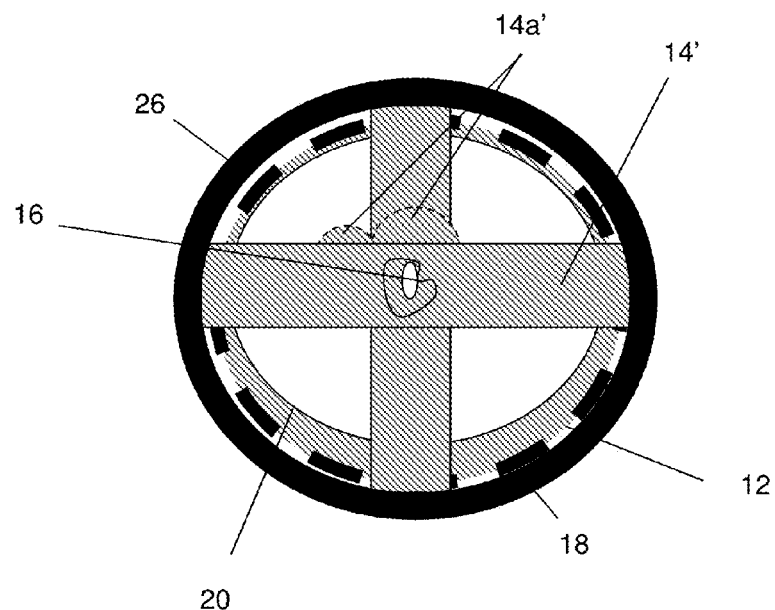
FIG. 6 shows a top view of the wafer container inserted into a shipping container, in accordance with aspects of the present invention.

FIG. 6 shows a top view of the wafer container inserted into a shipping container, in accordance with additional aspects of the present invention. More specifically, the shipping container 26 can be any known container used to ship wafers, e.g., plastic containers with a diameter of about the size of the wafers, themselves. The wafers 20 are placed in the wafer container 10 and thereafter placed in the shipping container 26. In this configuration, the straps 14 include the tabs 14a' for ease of handling, and slits 16 in order to attached adjacent straps to one for shipping. The force distribution plates 24 can be implemented in this aspect of the invention.

Figure 7:
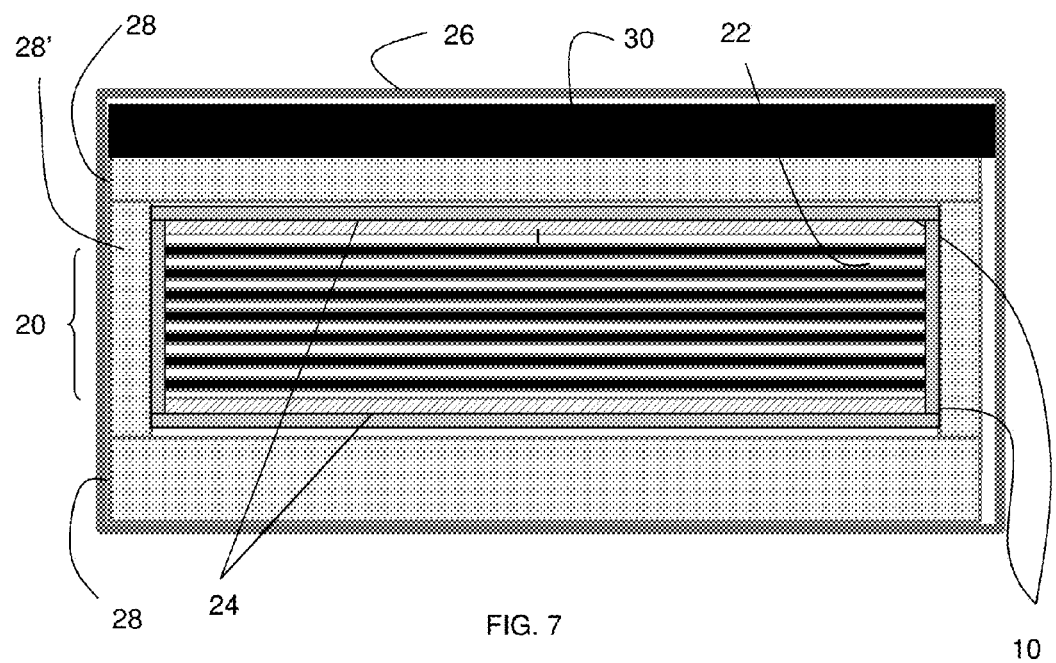
FIG. 7 shows a side cross-sectional view of the wafer container inserted within a shipping container, in accordance with aspects of the present invention.

FIG. 7 shows a side cross-sectional view of the wafer container inserted within a shipping container, in accordance with additional aspects of the present invention. In this implementation, two force distribution plates 24 and the stack of wafers 20 (separated by the sheets 22) are placed within the wafer container 10. The force distribution plates 24 are provided on the top side and bottom side of the stack of wafers 20, and the wafer container 10 is placed within the shipping container 26. Foam cushions or sheets 28 can be provided over and under the force distribution plates 24, on opposing sides of the stack of wafers 20. In optional embodiments, one or more perimeter cushions or sheets 28' are provided about the edges or perimeter of the stack of wafers 20 to prevent lateral movement of the thin wafers during shipping. Also, in optional embodiments, a reinforced cover 30 is provided on the upper foam cushion 22 to provide added protection during shipping.

Figure 8:
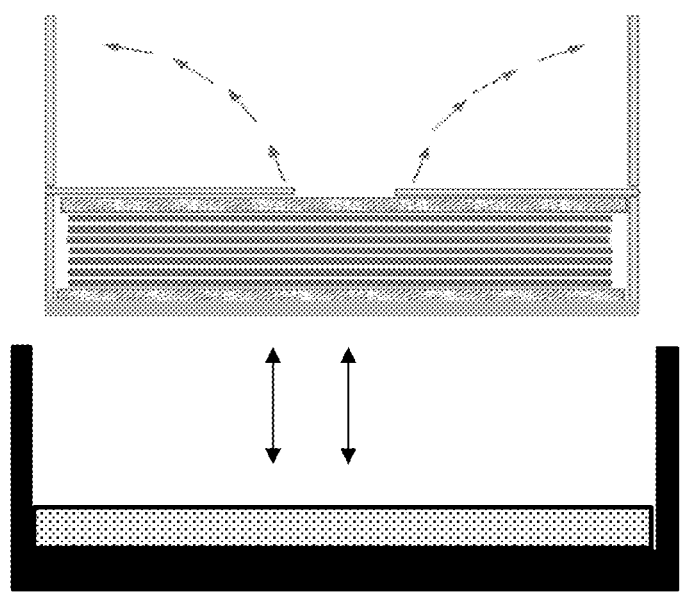
FIG. 8 is representative of a packing and unpacking procedure in accordance with aspects of the present invention.

As represented by FIG. 8, the shipping container 26 can be assembled as follows:

(i) the straps of the wafer container are spread out, allowing access to the bottom surface;

(ii) a lower force distribution plate is placed on the bottom surface of the wafer container;

(iii) a plurality of wafers and sheets are alternately stacked on the lower distribution plate, on the bottom surface of the wafer container. The wafers can be stacked (and unstacked) using a conventional vacuum wand;

(iv) an upper force distribution plate is placed on an uppermost sheet of the stack of wafers;

(v) at any stage before, during or after steps (i)-(iv), a foam cushion can be placed on a bottom of the shipping container. At similar stages, in optional embodiments, the perimeter foam cushions can also be placed in the shipping container;

(vi) the straps of the wafer container are grasped by a user, e.g., the straps are held together above the upper force distribution plate;

(vii) the user picks up the wafer container, using the straps, and places the assembly within the shipping container (on the foam);

(viii) the user folds the straps in the manner already described herein;

(ix) upper foam is placed on the wafer container, above the upper force distribution plate;

(x) in embodiments, a top cover can be placed on the upper foam; and (xi) the container is sealed.

The wafer shipping container may then be disassembled by reversing the assembly process. It should be understood by those of ordinary skill in the art, that the unloading (unpacking) process does not necessarily require removal of the lower distribution plate, the lower foam sheet or the perimeter cushions.

Table 1 shows testing performed on 100 micron, 85 micron, 75 micron and 65 micron wafers. As shown in this table, each of the wafers passed all testing: downward pressure test, vibration test and drop test.

TABLE 1

| Wafer Thickness (microns) | Downward pressure Test | Vibration Test | Drop Test |
| --- | --- | --- | --- |
| 100 microns | Passed | Passed | Passed |
| 85 microns | Passed | Passed | Passed |
| 75 microns | Passed | Passed | Passed |
| 65 microns | Passed | Passed | Passed |

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A package assembly comprising:
   a container having a bottom surface and a plurality of straps attached thereto;
   at least one force distribution plate positioned in relation to the container;
   a stack of wafers positioned above the at least one force distribution plate;
   at least one foam cushion contacting the at least one force distribution plate; and
   a plurality of tabs extending from an outermost perimeter of the bottom surface and positioned between the bottom surface and the plurality of straps.

2. The package assembly of claim 1, wherein the container comprises an electrostatic discharge (ESD) compliant material.

3. The package assembly of claim 1, wherein the straps are hinged or flexible.

4. The package assembly of claim 3, wherein each of the plurality of straps is spaced equidistance from one another about the bottom surface.

5. The package assembly of claim 1, wherein the plurality of straps include tabbed portions.

6. The package assembly of claim 1, wherein the plurality of straps include slits.

7. The package assembly of claim 1, wherein the at least one force distribution plate is positioned within the container.

8. The package assembly of claim 7, wherein the at least one force distribution plate is structured to:
   distribute forces over the stack of wafers within the container; and
   contain the stack of wafers as a unit allowing them to move as a unit.

9. A package assembly, comprising:
   a wafer container comprising a bottom surface and a plurality of straps extending therefrom;
   a stack of wafers positioned within the wafer container;
   one or more foam cushions or sheets positioned about the stack of wafers;
   a force distribution plate positioned beneath the stack of wafers and contacting the one or more foam cushions or sheets; and
   a plurality of tabs extending from an outermost perimeter of the bottom surface and positioned between the plurality of straps and the bottom surface.

10. The package assembly of claim 9, wherein:
    the wafer container comprises electrostatic discharge (ESD) compliant material;
    the straps are one of a hinged and flexible material; and
    each of the plurality of straps is spaced equidistance from one another about the bottom surface.

11. The package assembly of claim 9, wherein straps of the plurality of straps include at least one of tabbed portions and slits.

12. The package assembly of claim 9, further comprising:
    a shipping container which holds the wafer container; and
    upper and lower foam cushions or sheets positioned above and below the wafer container, wherein the one or more foam cushions or sheets are positioned about a periphery of the stack of wafers.

* * * * *